United States Patent
Regier et al.

(10) Patent No.: US 8,797,025 B2
(45) Date of Patent: Aug. 5, 2014

(54) COMPENSATION METHODS FOR DIGITAL SOURCE-MEASURE-UNITS (SMUS)

(75) Inventors: Christopher G. Regier, Cedar Park, TX (US); L. Rolando Ortega-Pohlenz, Austin, TX (US)

(73) Assignee: National Instruments Corporation, Austin, TX (US)

( * ) Notice: Subject to any disclaimer, the term of this patent is extended or adjusted under 35 U.S.C. 154(b) by 580 days.

(21) Appl. No.: 13/154,237

(22) Filed: Jun. 6, 2011

(65) Prior Publication Data

US 2012/0306517 A1    Dec. 6, 2012

(51) Int. Cl.
    G01B 7/14    (2006.01)
    G01B 7/30    (2006.01)
    G01R 33/06    (2006.01)
    G01R 31/28    (2006.01)

(52) U.S. Cl.
    CPC .................................. G01R 31/2841 (2013.01)
    USPC ................. 324/207.16; 324/750.01; 324/225; 324/692

(58) Field of Classification Search
    CPC .......................... G01R 15/202; G01R 31/2841
    USPC ..................................................... 324/750.01
    See application file for complete search history.

(56) References Cited

U.S. PATENT DOCUMENTS

| | | | |
|---|---|---|---|
| 5,579,236 A * | 11/1996 | Tamamura et al. | 702/64 |
| 5,754,041 A | 5/1998 | Kaito et al. | |
| 5,970,074 A | 10/1999 | Ehiro | |
| 7,502,697 B2 | 3/2009 | Holmquist et al. | |
| 7,903,008 B2 | 3/2011 | Regier | |
| 2009/0015221 A1 | 1/2009 | Kodera | |
| 2012/0082151 A1* | 4/2012 | Liu et al. | 370/342 |

OTHER PUBLICATIONS

"NI PXIe-4154: Battery Simulator Optimized for Mobile Device Test," National Instruments Corporation, Oct. 11, 2010, 4 pages.

* cited by examiner

Primary Examiner — Arleen M Vazquez
Assistant Examiner — Alesa Allgood
(74) Attorney, Agent, or Firm — Meyertons Hood Kivlin Kowert & Goetzel, P.C.; Jeffrey C. Hood (57) ABSTRACT

A source-measure unit (SMU) may be implemented with respective digital control loops for output voltage and output current. The output voltage and output current may be measured with dedicated ADCs (analog-to-digital converters). The readings obtained by the ADCs may be compared to a setpoint, which may be set in a digital loop controller. The digital loop controller may be used to produce an output to drive a DAC (digital-to-analog converter) until the output voltage and/or output current and/or a function thereof reach the respective desired levels. The digital loop controller may implement respective integrating functions for the respective digital control loops, and may also implement a compensation function featuring pole-zero pairs to stabilize the respective current/voltage outputs. Coefficients of the compensation function may be calculated based on user programmable parameters corresponding to the gain bandwidth product, compensation frequency, and ratio of the added pole-zero frequencies.

22 Claims, 6 Drawing Sheets

COMPENSATION METHODS FOR DIGITAL SOURCE-MEASURE-UNITS (SMUS)

INCORPORATION BY REFERENCE

U.S. Pat. No. 7,903,008 B2 is hereby incorporated by reference as though fully and completely set forth herein.

BACKGROUND OF THE INVENTION

1. Field of the Invention

This invention relates generally to measurement and data acquisition systems and, more particularly, to the design of digital source-measure units.

2. Description of the Related Art

Scientists and engineers often use measurement systems to perform a variety of functions, including measurement of a physical phenomena a unit under test (UUT) or device under test (DUT), test and analysis of physical phenomena, process monitoring and control, control of mechanical or electrical machinery, data logging, laboratory research, and analytical chemistry, to name a few examples.

A typical measurement system comprises a computer system, which commonly features a measurement device, or measurement hardware. The measurement device may be a computer-based instrument, a data acquisition device or board, a programmable logic device (PLD), an actuator, or other type of device for acquiring or generating data. The measurement device may be a card or board plugged into one of the I/O slots of the computer system, or a card or board plugged into a chassis, or an external device. For example, in a common measurement system configuration, the measurement hardware is coupled to the computer system through a PCI bus, PXI (PCI extensions for Instrumentation) bus, a GPIB (General-Purpose Interface Bus), a VXI (VME extensions for Instrumentation) bus, a serial port, parallel port, or Ethernet port of the computer system. Optionally, the measurement system includes signal-conditioning devices, which receive field signals and condition the signals to be acquired.

A measurement system may typically include transducers, sensors, or other detecting means for providing "field" electrical signals representing a process, physical phenomena, equipment being monitored or measured, etc. The field signals are provided to the measurement hardware. In addition, a measurement system may also typically include actuators for generating output signals for stimulating a DUT.

Measurement systems, which may also be generally referred to as data acquisition systems, may include the process of converting a physical phenomenon (such as temperature or pressure) into an electrical signal and measuring the signal in order to extract information. PC-based measurement and data acquisition (DAQ) systems and plug-in boards are used in a wide range of applications in the laboratory, in the field, and on the manufacturing plant floor, among others. Typically, in a measurement or data acquisition process, analog signals are received by a digitizer, which may reside in a DAQ device or instrumentation device. The analog signals may be received from a sensor, converted to digital data (possibly after being conditioned) by an Analog-to-Digital Converter (ADC), and transmitted to a computer system for storage and/or analysis. Then, the computer system may generate digital signals that are provided to one or more digital to analog converters (DACs) in the DAQ device. The DACs may convert the digital signal to an output analog signal that is used, e.g., to stimulate a DUT.

Multifunction DAQ devices typically include digital I/O capabilities in addition to the analog capabilities described above. Digital I/O applications may include monitoring and control applications, video testing, chip verification, and pattern recognition, among others. DAQ devices may include one or more general-purpose, bidirectional digital I/O lines to transmit and received digital signals to implement one or more digital I/O applications. DAQ devices may also include a Source-Measure Unit (SMU), which may apply a voltage to a DUT and measure the resulting current, or may apply a current to the DUT and measure the resulting voltage. SMUs are typically configured to operate according to what is commonly referred to as "compliance limits", to limit the output current when sourcing voltage, and limit the output voltage when sourcing current. In other words, a compliance limit on the measured signal may determine the (maximum) value of the sourced signal. For example, when applying a source voltage to a DUT and measuring current, a given current value (e.g. 1 A) specified as the compliance limit would determine the (maximum) input (source) voltage that might be provided to the DUT. In most cases compliance limits may depend and/or may be determined based on the DUTs, e.g. the maximum (absolute) value of the current that may flow into the DUT, or the maximum (absolute) value of the voltage that may be applied across the terminals of the DUT.

In the case of most SMUs, the setpoint (the desired output voltage when sourcing and regulating voltage, or the desired current value when sourcing and regulating current) and the compliance limits are typically programmable. SMUs are available to cover a variety of signal levels, from the microvolt ($\mu$V) range to the kilovolt (kV) range, and from the femtoampere (fA) range to the ampere (A) range. Some SMUs can deliver or dissipate significant power, while other SMUs may be operated at low power. The accuracy of SMUs is typically less than the accuracy of high-quality calibrators and/or digital multi meters (DMMs).

For quite a while, SMUs were implemented with precision digital-to-analog converters (DACs) used for programming the setpoint and compliance limits into an analog control loop. The output voltage across the output terminals of the SMU, or the output current flowing into the output terminal of the SMU were typically set using the analog control loops by comparing the outputs to the levels set by the DACs. Each output voltage or output current could be controlled separately, with only one of the analog control loops closed at any given time. Voltage values representative of current and voltage measurements were provided to an analog-to-digital (ADC) element. In some SMUs, separate ADCs (instead of a single ADC) were used to read the analog output voltage or the analog output current. These SMUs were generally limited in flexibility and high in complexity, resulting from requirements to minimize glitches during range switching. In order for the SMU to operate accurately, a high level of accuracy was required for the DACs and ADCs configured in the SMU.

A more recent trend has been to implement SMUs with a control loop configured in the digital domain. The output voltage and output current in such a configuration is measured with dedicated ADCs. When sourcing current, the current readings obtained by the ADCs are compared to a Current Setpoint, and when sourcing voltage, the voltage readings are compared to a Voltage Setpoint, to regulate the current and voltage outputs, respectively. The setpoints can be set, for example, in an FPGA (field programmable gate array) or DSP (digital signal processing) chip. The FPGA or DSP chip can be used accordingly to produce an output to drive a DAC until the output voltage and/or output current reach the respective desired levels. The SMU can be configured to source one type of signal while measuring another type of signal. For example, the SMU can be configured to measure the voltage across the terminals of a device under test (DUT), when sourcing (and regulating) a current to the DUT, and similarly, the SMU can be configured to measure the current flowing into the DUT, when sourcing (and regulating) the voltage applied across the terminals of the DUT.

Overall, SMUs designed with a digital control loop offer a number of advantages. For example, DAC errors can be corrected by the digital loop, reducing the accuracy requirements on the DAC, and the control algorithm may be as simple or as complex as desired, and may be configured ranging from a simple integrator to a nonlinear adaptive system, offering the potential to enhance stability and speed. However, in may cases, the operation of SMUs, and the specifically the response of SMUs to various loads still needs to be optimized.

Other corresponding issues related to the prior art will become apparent to one skilled in the art after comparing such prior art with the present invention as described herein.

SUMMARY OF THE INVENTION

In one set of embodiment, the SMU may be configured to check the measured entity (current or voltage) against specified compliance limits, which may effectively limit the magnitude of the sourced signal. The SMU may be configured to vary (lower) the regulated current or voltage from its respective setpoint, when the measured voltage or current, respectively, exceeds the value specified by the compliance limit. For example, if the setpoint for sourcing and regulating current is 1 A, and the voltage compliance limit is 5V, if sourcing a 1 A current in the DUT results in a measured voltage that exceeds 5V, the SMU may lower the current to below 1 A until the measured voltage no longer exceeds the allowed 5V. Similarly, if the setpoint for sourcing and regulating voltage is 5V, and the current compliance limit is 1 A, if sourcing a 5V voltage across the terminals of the DUT results in a measured current that exceeds 1 A, the SMU may lower the voltage to below 5V until the measured current no longer exceeds the allowed 1 A.

The readback values (for the measured current and/or voltage) may be obtained by averaging the current and/or voltage values received from the ADCs. The averaging may be weighted to provide noise rejection advantages. Placing the control loop in the digital domain may result in added flexibility of the SMU, and a decrease in the accuracy requirements on the DAC. The digital control loop may also offer the possibility of novel approaches for solving potential range-switching issues that may arise within the SMUs.

In one set of embodiments, an SMU may comprise output terminals configured to couple the SMU to a DUT, and further configured to convey an analog output signal to the DUT to effect an output current flowing into the DUT and an output voltage in the DUT. The SMU may include a first converter configured to generate a first digital value representative of the output current, a second converter configured to generate a second digital value representative of the output voltage, and a digital loop controller configured to receive the first digital value and the second digital value, and generate a digital control signal based on the first digital value and the second digital value to regulate a specified function of the output current and the output voltage to remain at a value corresponding to a setpoint. The specified function may be the output current, the output voltage, power, or resistance, to name a few. The first digital value, being representative of the output current, may correspond to a current measurement, and the second digital value being representative of the output voltage may correspond to a voltage measurement. The first digital value and second digital value may therefore effectively be used in measuring and/or controlling any function, which may be defined and/or processed in the digital loop controller. For example, multiplying the first digital value and the second digital value may provide a measurement of power. Accordingly, the digital control value may be generated by the digital loop controller to effect desired changes in the output current and/or the output voltage depending on what the selected function is. For example, if the selected function is power, then both the output current and output voltage may be regulated, or only one of the output current and output voltage may be regulated based on the measured output current and output voltage.

In one set of embodiments, the digital loop controller may implement respective integrating functions for the respective digital current control loop and the respective digital voltage control loop. The digital loop controller may also implement a compensation function featuring pole-zero pairs to stabilize the respective current/voltage outputs. Coefficients of the compensation function may be calculated based on: user programmable parameters corresponding to the gain bandwidth product associated with the integrating function, each compensation frequency that is the geometric mean of the pole frequency and zero frequency for a given pole-zero pair, and the pole-zero ratio of the respective frequencies associated with the added pole-zero pairs. Overall, embodiments of an SMU comprising a digital control loop as disclosed herein offer the advantages of a simple control algorithm such as a simple integrator, with enhanced stability and speed by employing the compensation methods also disclosed herein.

In one set of embodiments, an SMU may include output terminals to couple the SMU to the input terminals of a DUT, to convey an analog output signal to the DUT to effect an output voltage across the input terminals of the DUT, to effect an output current flowing into the DUT. The SMU may include a first converter to generate a first digital value representative of the output current, and may also include a second converter to generate a second digital value representative of the output voltage. The SMU may further include a digital loop controller receiving the first digital value and the second digital value, and generating a digital control signal based on the first digital value and the second digital value to regulate a specified function of the output current and the output voltage to remain at a value corresponding to a setpoint. The digital loop controller may operate according to an integrating function, and may further operate according to a compensating function to stabilize the analog output signal according to user programmable values corresponding to one or more compensation poles and zeros.

The compensating function in the digital loop controller may operate to stabilize the analog output signal according to a plurality of respective user programmable values of compensation pole-zero pairs. Each of the plurality of respective compensation pole-zero pairs may be defined by: a geometric mean of a first frequency corresponding to the respective compensation pole of the respective compensation pole-zero pair and a second frequency corresponding to the respective compensation zero of the respective compensation pole-zero pair, and a ratio of the first frequency to the second frequency.

A method for providing an output current and an output voltage to a DUT for testing the DUT may include regulating, via respective digital feedback loops for the output current and the output voltage, a specified function of the output current and the output voltage to remain at a desired value corresponding to a setpoint. The regulating may include performing respective integrating functions within the respective digital feedback loops, and stabilizing the respective digital feedback loops through respective corresponding compensating functions, which may include providing respective specified input parameters to the respective corresponding compensating functions. In one set of embodiments, the respective specified input parameters include: gain bandwidth corresponding to a gain of the respective integrating function, compensation frequency corresponding to a geometric mean of a first frequency associated with a respective compensation pole and a second frequency associated with a respective compensation zero, and a pole-zero frequency ratio corresponding to a ratio of the first frequency to the second frequency.

BRIEF DESCRIPTION OF THE DRAWINGS

The foregoing, as well as other objects, features, and advantages of this invention may be more completely understood by reference to the following detailed description when read together with the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "coupled" means "directly or indirectly connected".

DETAILED DESCRIPTION OF THE EMBODIMENTS

Figure 1:
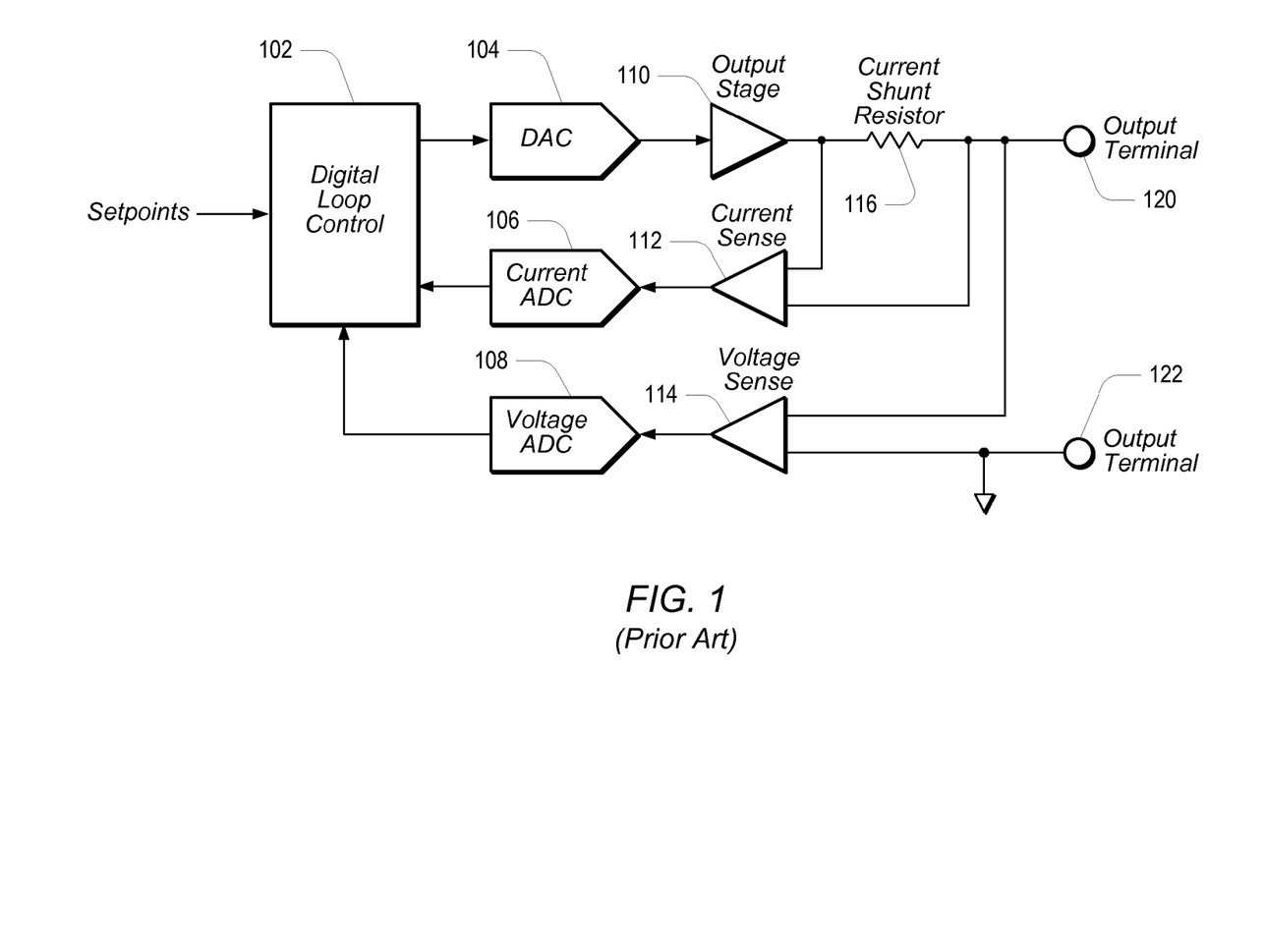
FIG. 1 shows the basic architecture of a prior art SMU featuring a digital loop controller.

FIG. 1 shows the basic architecture of one embodiment of a prior art SMU (source-measure unit) in which the entire control loop has been configured in the digital domain. A DUT (device under test), not shown, may be coupled between output terminals 120 and 122. Setpoints and compliance limits may be provided (programmed) to Digital Loop Controller (DLC) 102, which may provide a control output through DAC (digital-to-analog converter) 104 to Output Stage 110. Feedback from Output Stage 110 may be provided to Current ADC (analog-to-digital converter) 106 and Voltage ADC 108 via respective Current Sense element 112 and Voltage Sense element 114. The current feedback may be taken from the current flowing through current shunt resistor 116, and the feedback voltage may be taken from across output terminals 120 and 122. Current ADC 106 and Voltage ADC 108 may then provide the readback current and voltage values into DLC 102.

DLC 102 may be configured to check the measured current (from Current ADC 106) resulting from a sourced voltage, against the specified current compliance limit provided (or programmed) into DLC 102. DLC 102 may similarly be configured to check the measured voltage (from Voltage ADC 108) resulting from a sourced current, against the specified voltage compliance limit provided (or programmed) into DLC 102. To regulate the output, DLC 102 may be configured to check the measured current (from Current ADC 106) resulting from a sourced current, against the specified current setpoint provided (or programmed) into DLC 102. DLC 102 may similarly be configured to check the measured voltage (from Voltage ADC 108) resulting from a sourced voltage, against the specified voltage setpoint provided (or programmed) into DLC 102.

The compliance limits may effectively limit the magnitude of the sourced signals. DLC 102 may be configured to vary (lower) the regulated current or voltage from its respective setpoint, when the measured voltage or current, respectively, exceeds the value specified by the compliance limit. For example, if the setpoint for sourcing and regulating current is 1 A, and the voltage compliance limit corresponding to a given DUT is 5V, when sourcing a 1 A current in the DUT results in a voltage measurement that exceeds 5V, DLC 102 may operate to lower the value of the sourced current below 1 A, until a sourced current value is reached for which the measured voltage no longer exceeds the allowed 5V. Similarly, if the setpoint for sourcing and regulating voltage is 5V, and the current compliance limit corresponding to a given DUT is 1 A, when sourcing a 5V voltage across the terminals of the DUT results in a current measurement that exceeds 1 A, DLC 102 may operate to lower the value of the sourced voltage below 5V, until a sourced voltage value is reached for which the measured current no longer exceeds the allowed 1 A.

The Digital Loop Controller (e.g. DLC 102) may provide the added flexibility of being able to operate the SMU for different compliance limits, (and being able to program multiple setpoints), without additional components. In addition, the loop bandwidth may easily be adjusted by changing the controller coefficients, and control loop adjustments may be made through measurable and controllable settling times of the signal. The DLC may also be reconfigurable to the desired mode, controlling/generating current, voltage, power, resistance, or voltage with series impedance, which may be valuable in battery simulation applications.

In one set of embodiments, DLC 102 may be implemented with an ASIC, a DSP, an FPGA, or any other suitable digital circuitry configured to perform the designated functions of DLC 102. An FPGA may be preferable for implementations utilizing National Instruments' LabVIEW graphical programming interface to write and simulate the control code. When using an FPGA with LabVIEW, the control code may be deployed and tested through LV-FPGA (LabVIEW FPGA). The control system itself may be designed to emulate a traditional SMU, while allowing users to implement more advanced features by writing their own control algorithm (for example in LV-FPGA when using LabVIEW and an FPGA). Some embodiments may also implement more advanced features such as constant power delivery or sinking, or constant resistance generation. For safety considerations, especially in user-configured situations, the output of DAC 104 may be limited to a safe level, regardless of feedback.

It should also be noted that when trying to regulate power, for example, two ADCs may be required for obtaining the requisite measurements for the power regulation to be performed. One ADC may be required to measure current (e.g. ADC 106) and another ADC may be required to measure voltage (e.g. ADC 108), with the multiplication (to obtain the power value that may be compared to a setpoint) performed digitally, in DLC 102, for example. Thus, certain embodiments, where the sourced and measured entity is the same (e.g. sourcing current and measuring current), may be configured with a single ADC. In one set of embodiments, when only always one entity (e.g. Current or Voltage) is to be measured, one of the ADCs may simply be removed. In another set of embodiments, the output from the Current Sense element and the output of the Voltage Sense element may be input to a multiplexer (not shown in any of the figures), which may be used to select whether sensed voltage or sensed current is to be converted to the digital value provided to the digital loop controller. These embodiments may be useful, for example, in certain applications where compliance limits were unnecessary, and/or the primary functionality was regulation of the output.

In one set of embodiments, the control algorithm (which may be implemented in DLC 102) may be a PID (proportional integral derivative) controller or a variant thereof. In yet other embodiments the control algorithm may be based on fuzzy logic, or it may be nonlinear. The control algorithm may additionally be devised as an adaptive algorithm. In certain embodiments it may be configured to include programmable speed/stability tradeoff. For example, as a simple substitute for an adaptive control algorithm, the speed/stability tradeoff may be exposed to the users, who may be able to choose stable/normal/fast with any degree of resolution to match their expected test setup. The control system may also be designed to compensate for the load presented by an attenuator that may be required to measure high voltages.

Figure 2:
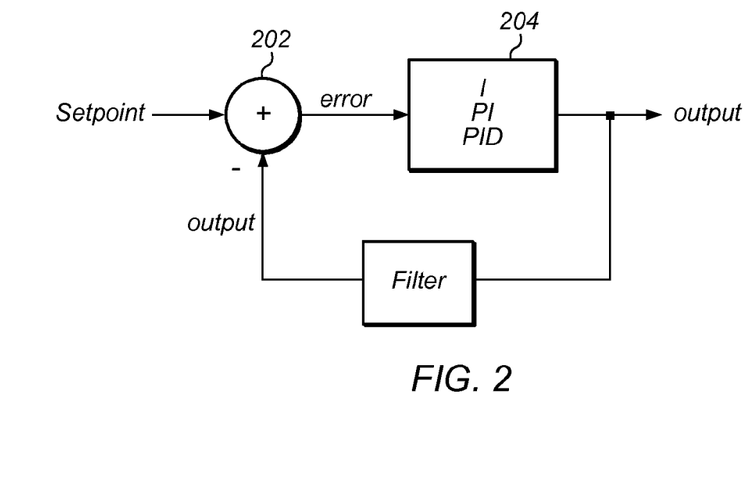
FIG. 2 shows a simplified control loop diagram used for modeling the digital current loop or the digital voltage loop in FIG. 1.

In case the control algorithm implemented in DLC 102 is an Integral (I) or Proportional Integral (PI), or Proportional Integral Derivative (PID) controller, the control loop structure of the SMU shown in FIG. 1 may be modeled as shown in FIG. 2. Block 204 represents certain specified functions/functionality of the controller, more specifically in this case, the error signal processing functionality of the controller, with the output provided in a feedback loop to summation node 202, where it is subtracted from the programmed setpoint value to generate the error signal provided to processing block 204. The output may represent the feedback signal corresponding to the load current and provided by ADC 106, as shown in FIG. 1. Similarly, the output may represent the feedback signal corresponding to the voltage output and provided by ADC 108, as shown in FIG. 1. In various embodiments, a filter may also be included in the feedback path from the output of controller 204 to summation node 202. While the Integral term in the PID controller may be essential for low steady-state error, and the Proportional term may help with loop stability, the Derivative term may provide no advantages, and may in fact introduce a considerable amount of noise. The Proportional term may also introduce a considerable amount of noise when the term reaches a certain size (i.e. the term gets large). Therefore, it may be desirable to provide alternative methods of compensation for the feedback loop system shown in FIG. 1, specifically, methods that alleviate and/or eliminate some or all of the issues mentioned above. Furthermore, it may be desirable to provide compensation with the capacity and/or capability to choose compensation parameters that are more deterministic, instead of obtaining a desired combination of parameters by heuristic means such as testing different combinations of parameters through trial and error.

Figure 3:
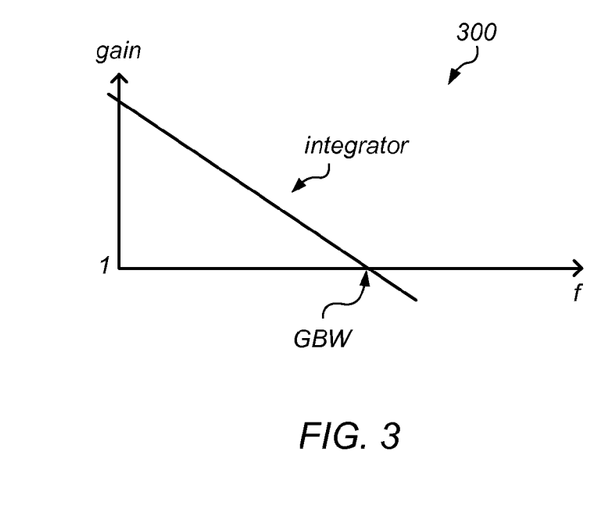
FIG. 3 shows a diagram illustrating the gain bandwidth product with respect to frequency for one embodiment of an integrator.

In one set of embodiments, a compensation method may include the use of poles and zeroes in conjunction with an integrating response—the Integrating term of the PID compensation algorithm—which may set an overall Gain-Bandwidth product (GBW) for the digital control loop. The basic relationship between the GBW and frequency for an Integral controller is illustrated in the diagram shown in FIG. 3. The Proportional term of the PID may be equivalent to adding a zero to the digital control loop. By adding an appropriately placed pole in addition to this zero, the noise added by the zero/Proportional-term may be effectively managed. Certain systems may benefit from the addition of a pole without an added zero, which may turn the closed-loop response into a $2^{nd}$-order response, which features a better settling/noise tradeoff than the $1^{st}$-order response that might be obtained with just an Integral term.

Figure 4:
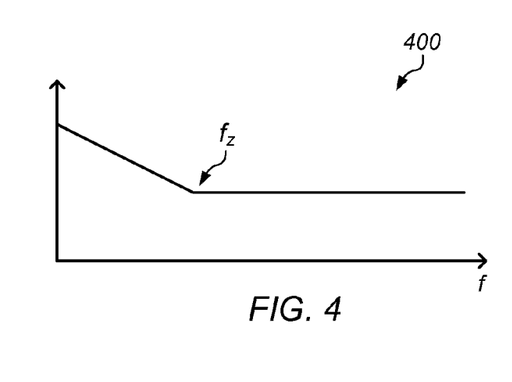
FIG. 4 shows a diagram illustrating the gain bandwidth product with respect to frequency for one embodiment of an integrator, when a zero is introduced at a specified frequency $f_z$.
Figure 5:
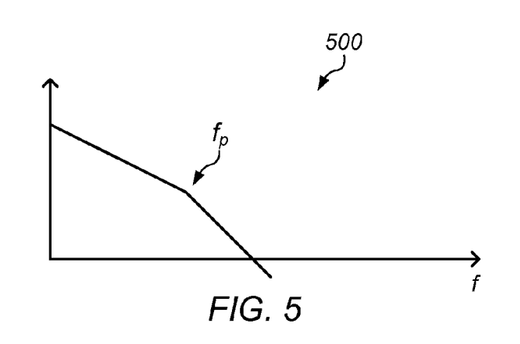
FIG. 5 shows a diagram illustrating the gain bandwidth product with respect to frequency for one embodiment of an integrator, when a pole is introduced at a specified frequency $f_p$.
Figure 6:
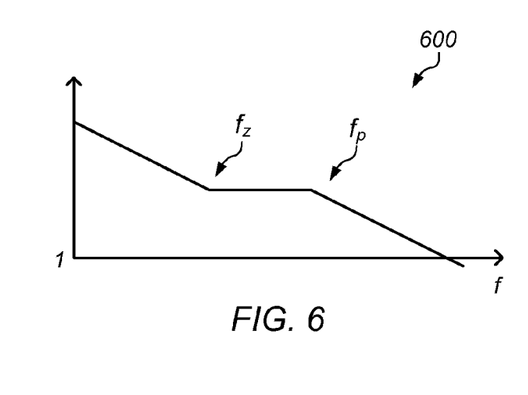
FIG. 6 shows a diagram illustrating the gain bandwidth product with respect to frequency for one embodiment of an integrator, when a pole-zero pair is introduced at respective specified frequencies $f_p$ and $f_z$, and $f_p/f_z$ is greater than 1.
Figure 7:
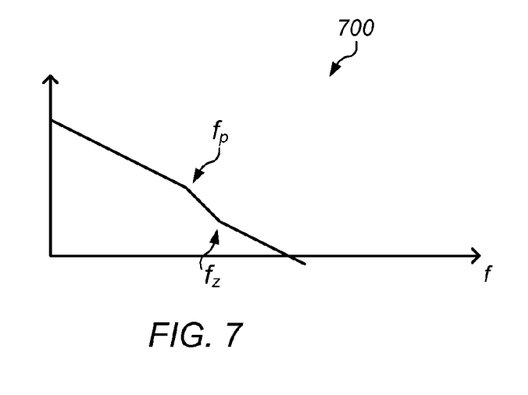
FIG. 7 shows a diagram illustrating the gain bandwidth product with respect to frequency for one embodiment of an integrator, when a pole-zero pair is introduced at respective specified frequencies $f_p$ and $f_z$, and $f_p/f_z$ is less than 1.

FIG. 4 shows a diagram 400 illustrating the effect on the GBW curve when introducing a zero at a given frequency $f_z$ for an Integrator. Diagram 500 in FIG. 5 illustrates the effect on the GBW curve when introducing a pole at a given frequency $f_p$ for an Integrator. Similarly, diagram 600 in FIG. 6 illustrates the effect on the GBW curve when introducing a zero at a first frequency $f_z$, and a pole at a second frequency $f_p$ for an Integrator, where $(f_p/f_z)>1$. Diagram 700 in FIG. 7 illustrates the effect on the GBW curve when introducing a zero at a first frequency $f_z$, and a pole at a second frequency $f_p$ for an Integrator, where $(f_p/f_z)<1$. In case $(f_p/f_z)=1$, that is, when $f_p$ and $f_z$ are equal to one another, there is no effect on the GBW curve, the respective effects of a zero and a pole at the same frequency practically canceling each other. While introducing a zero might introduce a phase boost, providing stability, it might also introduce noise. However, adding a pole subsequent to the zero may still provide the phase boost benefit of the added zero, while introducing less noise than the addition of a zero alone.

Figure 8:
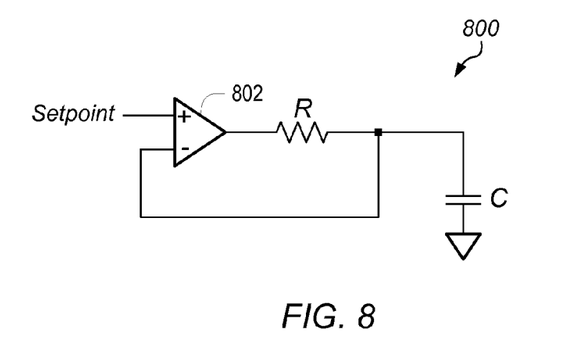
FIG. 8 shows a circuit representation of the functionality of the feedback loop shown in FIG. 2 for a capacitive load.

FIG. 8 provides a circuit representation of the functionality of the feedback loop(s) shown in FIG. 1, and FIG. 2. In circuit 800, capacitor C represents a load, and resistor R is used for measuring the current provided to the capacitive load.

Capacitor C and resistor R together form a pole, defined by:

$$f_p = \frac{1}{2*\pi*RC} \quad (1)$$

Figure 9:
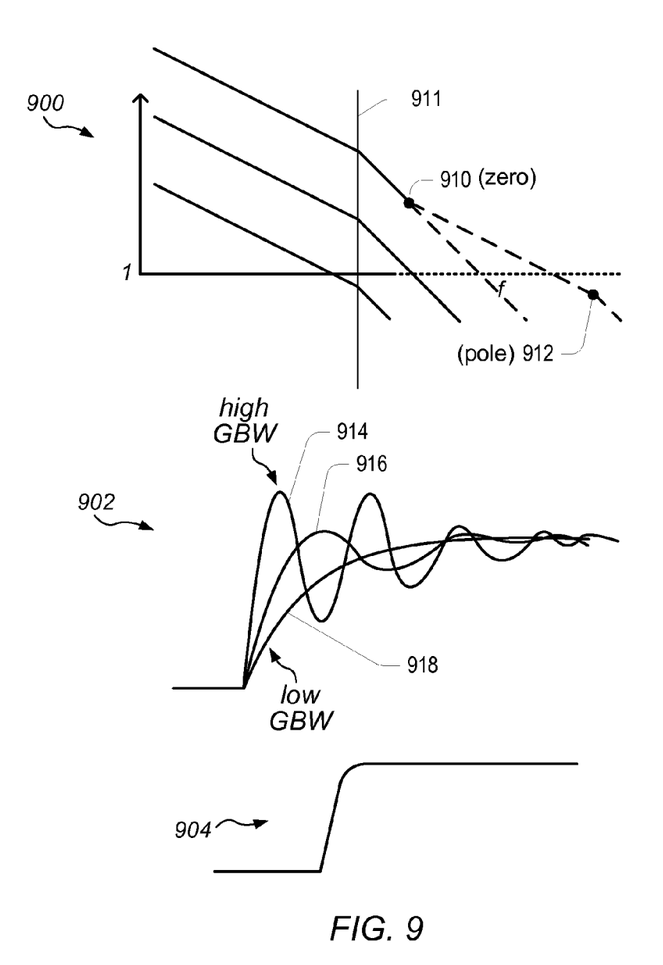
FIG. 9 shows a diagram illustrating the respective gain bandwidth product curves with respect to frequency for various different embodiments of an integrator, indicating where unity gain is crossed, and diagrams illustrating output signal behavior for the different gain bandwidth product values.

The overall loop gain when the loop represents an integrator is shown in diagram 900 of FIG. 9, with different curves/lines corresponding to GBW curves for different configurations, showing where unity gain is crossed. In other words, the different curves in diagram 900 correspond to the GBW for the Integrator for various gain values of the Integrator. The inflections in the curves occur at the frequency of the added pole caused by the capacitive load. Diagram 902 features possible step responses corresponding to different GBW values, for the configuration shown in FIG. 8. As seen in diagram 902, for a low overall GBW, the step response exhibits a fairly smooth curve 918. However, when attempting to increase the speed of the Integrator, the pole (defined in equation 1) begins to affect the step response, as seen in curve 916, and for a substantial speed increase, resulting in a high GBW, curve 914 exhibits the oscillation as shown. Adding a zero at point 910 and a pole at 912 may operate to reduce the phase lag, which may result in a response exemplified by diagram 904.

Figure 10:
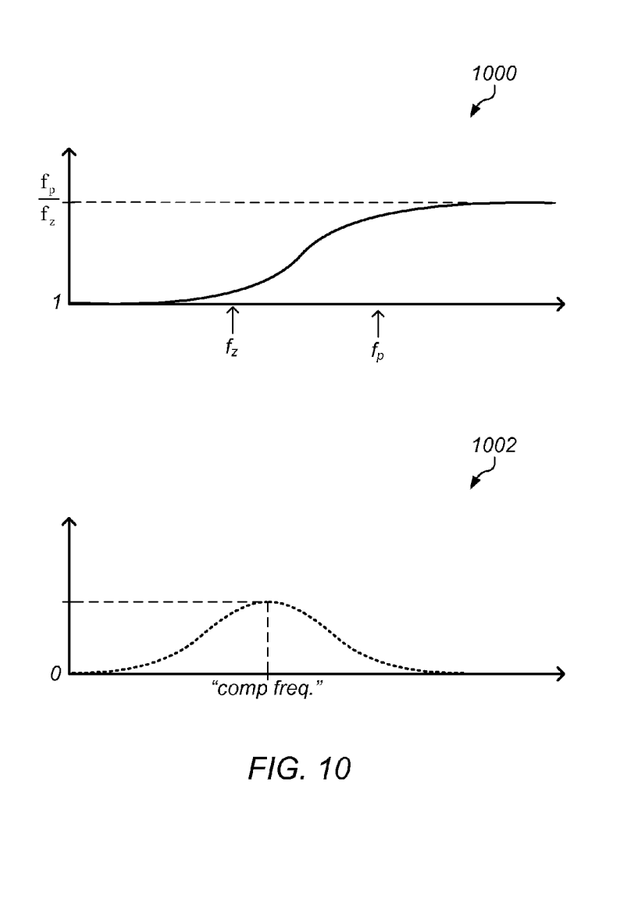
FIG. 10 shows diagrams illustrating the gain and phase response for a lead compensator.
Figure 11:
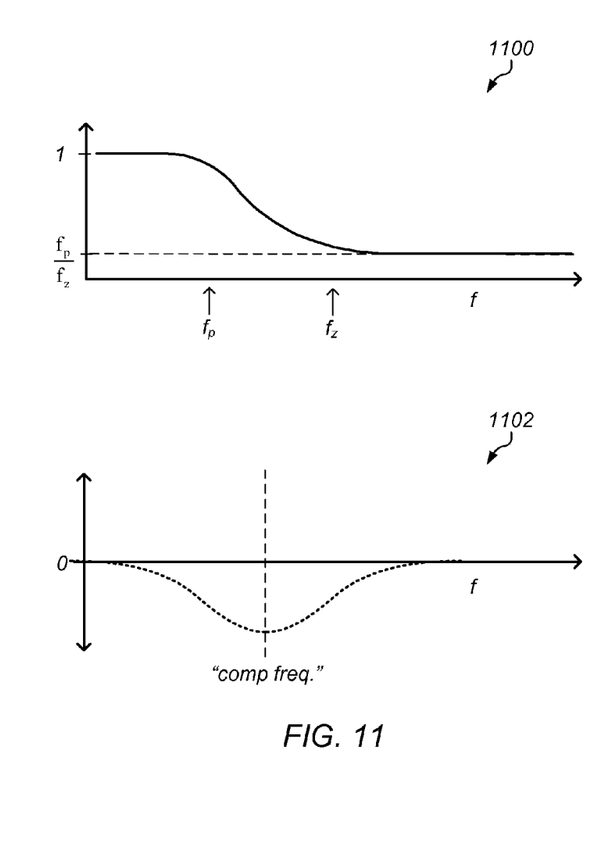
FIG. 11 shows diagrams illustrating the gain and phase response for a lag compensator.

Examples of gain vs. frequency, including phase response, for lead and lag compensators are provided in FIGS. 10 and 11, respectively. As seen in diagram 1000, a zero is introduced at frequency $f_z$, while a pole is introduced at frequency $f_p$, also resulting in a phase boost as shown in diagram 1002. In contrast, as exemplified in FIG. 11, a lag compensator provides the opposite effects, as shown in diagrams 1100 and 1102. A compensation method based on lead and lag compensation principles may be successfully applied to the SMU circuit shown in FIG. 1, to obtain desired responses when sourcing and measuring voltage and current for various loads.

Since the placement of poles and zeroes to stabilize a loop is generally not obvious, in one set of embodiments, poles and zeroes may be devised as pairs, where each pair is defined by two terms: the compensator frequency, which may be the geometric mean of the pole and zero frequencies, and the pole-zero ratio, which may be the ratio of the pole frequency to the zero frequency. This may simplify the compensation problem by improving the mapping between the compensation parameters and the actual behavior of the digital control loop. For example, a loop that exhibits ringing at a frequency f1 may often be adequately stabilized by placing a compensator at f1 and setting the pole-zero ratio to a specified, previously determined number, e.g. around 5. Higher values of a pole-zero ratio may improve the efficacy of the compensator at the expense of increasing noise.

The addition of a single pole-zero pair may effect a lead or lag compensator, as discussed above, which may be sufficient for many loads. However, various embodiments may be designed with an architecture that is extensible to allow multiple pole-zero pairs, for example to effect a lead-lag compensator. It is generally desirable to have separate compensators for the voltage loop and the current loop, since the two loops have different gains under most circumstances, and thus work best when compensated differently. In fact, it may be desirable to have separate GBWs (Integral terms) for the two loops as well.

Figure 12:
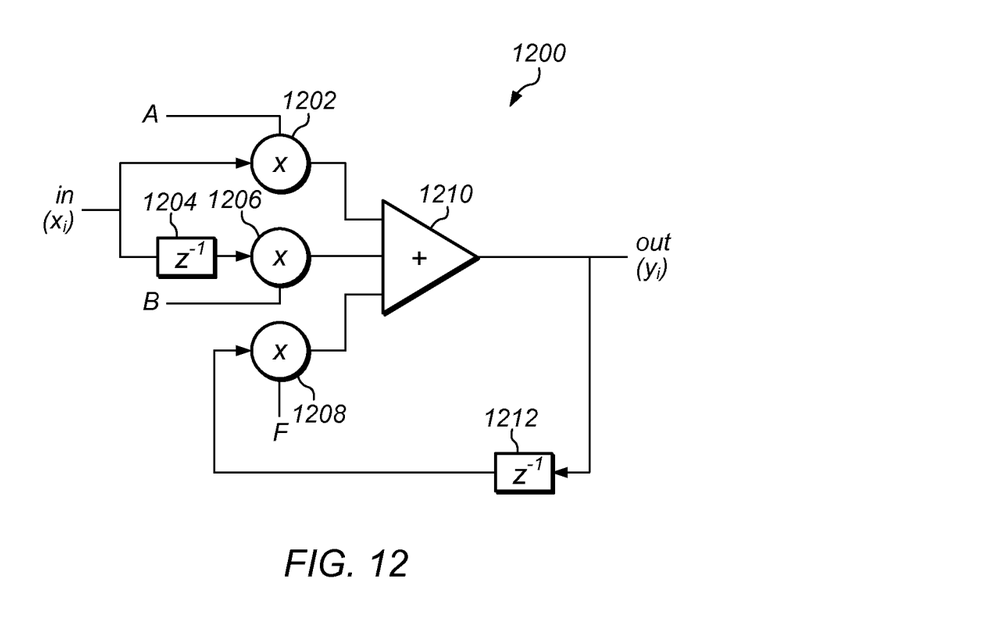
FIG. 12 shows a control diagram corresponding to a compensation function using parameters that may be determined from user entered gain bandwidth product, compensation frequency, and pole-zero ratio values.

In one set of embodiments, a user may access the SMU system, for example through a user interface, and may enter three desired values respectively corresponding to the GBW, the compensation frequency, and the pole-zero ratio. The GBW maps to how high the gain of the Integrator is, the compensation frequency maps to the geometric mean of the pole and zero frequencies (and may also be thought of as the frequency at which the compensator has the greatest effect on phase, also referred to herein as the frequency of maximum phase), and the pole-zero ratio maps to the ratio of the pole frequency to the zero frequency. Control diagram 1200 provides one example of the configuration for compensating the feedback loop using parameters A, B, and F, which may be determined from the user entered GBW, compensation frequency, and pole-zero ratio values. As seen in FIG. 12, an input signal (representing the $i^{th}$ sample) may be applied to multiplier block 1202, and may also be applied to delay 1204, the output of which may be applied to multiplier block 1206. The input signal may be multiplied by parameter A, while the delay output may be multiplied by parameter B. The feedback signal from the output of summer 1210 may be provided to delay 1212, the output of which may then be multiplied by parameter F by multiplier block 1208. Default values may be calculated for A, B, and F based on default values that are loaded into the SMU system, which may then be modified by the user.

Therefore, a single pole-zero compensator may be implemented with a single mathematical block as exemplified in control diagram 1200, where the output is the sum of three terms expressed by the following equation:

$$Y_i = A*X_i + B*X_{i-1} + F*Y_{i-1} \quad (2)$$

$Y_i$ represents the current output sample, $X_i$ represents the current input sample, $X_{i-1}$ represents a most recent previous input sample, and $Y_{i-1}$ represents a most recent previous output sample. Other mathematical representations are also possible and are contemplated, and while not explicitly disclosed, the principles relating to the various embodiments discussed herein may be applied to mathematical representations more specifically suited to the respective circuits and plant poles/zeros present in the specific SMU designs. Accordingly, there may be multiple ways to determine the three coefficients based on the desired pole and zero frequencies, and one example is provided below, in which the coefficients may be considered approximations defined by the following terms. The feedback coefficient F may be defined as:

$$F = e^{-\left(\frac{2*\pi*fp}{fs}\right)} \quad (3)$$

where fp is the pole frequency and fs is the sampling frequency. The delay coefficient B may be defined as:

$$B = \frac{F-1}{1 - e^{-\left(\frac{2*\pi*fz}{fs}\right)}} \quad (4)$$

where fz is the zero frequency. Finally, the direct coefficient A may be defined as:

$$A = 1 - (B+F) \quad (5)$$

with the sum of the three coefficients equaling unity, or 1.

It should also be noted that when the integrator is modeled as a block in the control loop, for example as shown in FIG. 2, the compensator block may be either placed in front of error signal processing block 204 (i.e. in front of the Integrator) in the forward path, or it may be placed in the feedback path. Overall, from a functional perspective, the compensator may be placed anywhere in the signal path. In all cases the compensator may have the same effects on the control loop, though it may have a slightly different effect on response to a setpoint change, depending on where the compensator is configured. Advantages of this compensation method include ease of management of a tradeoff between stability and noise, extensibility to many poles and zeroes for optimum response, successful mapping to measurable responses for easy compensation, lower noise and superior response than PID control alone, and computational efficiency.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

We claim:

1. A source-measure unit (SMU) comprising: output terminals configured to couple the SMU to a device under test (DUT), and further configured to convey an analog output signal to the DUT to effect: an output current flowing into the DUT; and an output voltage in the DUT; a first converter configured to generate a first digital value representative of the output current; a second converter configured to generate a second digital value representative of the output voltage; and a digital loop controller configured to receive the first digital value and the second digital value, and generate a digital control signal based on the first digital value and the second digital value to regulate a specified function of the output current and the output voltage to remain at a value corresponding to a setpoint, wherein the digital loop controller comprises: an integrating function selectively associated with regulation of the output current and regulation of the output voltage; and a compensating function configured to stabilize the analog output signal according to user programmable values corresponding to one or more compensation poles and zeros.

2. The SMU of claim 1, wherein the user programmable values comprise:
   a gain bandwidth product (GBW) corresponding to a gain of the integrating function;
   a compensation frequency corresponding to a geometric mean of:
      a pole frequency associated with a compensation pole; and
      a zero frequency associated with a corresponding compensation zero; and
   a ratio of the pole frequency to the zero frequency.

3. The SMU of claim 1, wherein the compensating function is further configured to stabilize the analog output signal according to a plurality of respective user programmable values of compensation pole-zero pairs, each of the plurality of respective compensation pole-zero pairs defined by:
   a geometric mean of a first frequency corresponding to the respective compensation pole of the respective compensation pole-zero pair, and a second frequency corresponding to the respective compensation zero of the respective compensation pole-zero pair; and
   a ratio of the first frequency to the second frequency.

4. The SMU of claim 1, wherein the compensating function is defined by the equation:

$$Y_i = A^* X_i + B^* X_{i-1} + F^* Y_{i-1};$$

wherein $Y_i$ represents a current value corresponding to an output of the compensating function, $X_i$ represents a current value corresponding to one of the first digital value and the second digital value, represents a most recent previous value corresponding to one of the first digital value and the second digital value, and $Y_{i-1}$ represents a most recent previous value corresponding to the output of the compensating function.

5. The SMU of claim 1, wherein an output of the compensating function is an input into the integrating function, and the digital control signal is the output of the integrating function.

6. The SMU of claim 1, wherein the digital controller comprises a setpoint comparison function, wherein an output of the compensating function is an input into the setpoint comparison function, and wherein the digital control signal is the output of the integrating function.

7. The SMU of claim 1, wherein the digital loop controller is further configured to receive one or more coefficients calculated from the user programmable values, as inputs into the compensating function.

8. The SMU of claim 7, wherein the one or more coefficients comprise one or more of:
   a feedback coefficient;
   a delay coefficient; or
   a direct coefficient.

9. The SMU of claim 8, wherein the feedback coefficient is defined by the equation:

$$e^{-\frac{2*\pi*fp}{fs}};$$

wherein fp is a specified first frequency corresponding to a first compensation pole; and
wherein fs is a sampling frequency of the SMU.

10. The SMU of claim 8, wherein the delay coefficient is defined by the equation:

$$\frac{F-1}{1-e^{-\frac{2*\pi*fz}{fs}}};$$

wherein fs is a sampling frequency of the SMU;
F is the feedback coefficient; and
wherein fz is a specified second frequency corresponding to a first compensation zero.

11. The SMU of claim 8, wherein the direct coefficient is defined by the equation:

$$1-(B+F);$$

wherein B is the delay coefficient; and
wherein F is the feedback coefficient.

12. A digital loop controller configured to regulate a specified function of an output current and an output voltage provided to a device under test (DUT) to remain at a value corresponding to a setpoint, wherein the digital loop controller comprises:
   an integrator configured to perform an integrating function selectively associated with regulation of the output current and regulation of the output voltage;
   a first compensator configured to perform a first compensation function that stabilizes the output current; and
   a second compensator configured to perform a second compensation function that stabilizes the output voltage;
   wherein the first compensator and the second compensator are each configured to operate according to respective programmable values corresponding to respective one or more compensation poles and zeros.

13. The digital loop controller of claim 12, wherein one or more of the first compensator and the second compensator is configured to operate according to one or more respective added pole-zero pairs, wherein each respective pole-zero pair is defined by:
   a compensator frequency derived from a geometric mean of a respective pole frequency corresponding to the respective added pole, and a respective zero frequency corresponding to the respective added zero; and
   a ratio of the pole frequency to the zero frequency.

14. The digital loop controller of claim 12, wherein the first compensator is configured in a feedback branch of a control loop, wherein the control loop comprises:
   the integrator and
   a feedback signal representative of the output current.

15. The digital loop controller of claim 12, wherein the second compensator is configured in a feedback branch of a control loop, wherein the control loop comprises:
   the integrator; and
   a feedback signal representative of the output voltage.

16. The digital loop controller of claim 12, wherein the first compensator and the second compensator are each configured to receive as respective inputs, respective one or more coefficients calculated from the respective programmable values.

17. The digital loop controller of claim 16, wherein the respective one or more coefficients comprise one or more of:
   a first coefficient based on:
      a first frequency corresponding to a compensation pole; and
      a sampling frequency corresponding to a converter configured to generate a representative digital value of the output current or the output voltage;
   a second coefficient based on:
      the first coefficient;
      a second frequency corresponding to a compensation zero; and
      the sampling frequency; or
   a third coefficient based on the first coefficient and the second coefficient.

18. A method for providing an output current and an output voltage to a device under test (DUT) for testing the DUT, the method comprising:
   regulating, via respective digital feedback loops for the output current and the output voltage, a specified function of the output current and the output voltage to remain at a desired value corresponding to a setpoint, said regulating comprising performing respective integrating functions within the respective digital feedback loops;
   stabilizing the respective digital feedback loops through respective corresponding compensating functions, comprising providing respective specified input parameters to the respective corresponding compensating functions, wherein the respective specified input parameters comprise:
      gain bandwidth corresponding to a gain of the respective integrating function;
      compensation frequency corresponding to a geometric mean of a:
         first frequency associated with a respective compensation pole; and
         a second frequency associated with a respective compensation zero; and
      a pole-zero frequency ratio corresponding to a ratio of the first frequency to the second frequency.

19. The method of claim 18, further comprising:
   calculating three respective coefficients (A, B, and F) from the respective specified input parameters;
   wherein each respective compensating function is defined by the equation:

$$Y_i = A*X_i + B*X_{i-1} + F*Y_{i-1};$$

wherein $Y_i$ represents a current value corresponding to an output of the respective compensating function, $X_i$ represents a current value corresponding to an input of the respective compensating function, $X_{i-1}$ represents a most recent previous value corresponding to the input of the respective compensating function, and $Y_{i-1}$ represents a most recent previous value corresponding to the output of the respective compensating function.

20. The method of claim 19, wherein said regulating via the respective digital control loop for the output current comprises:
   sampling the output current at a specified sampling frequency to obtain a digital current value; and
   one or more of:

$$F = e^{-\frac{2*\pi*fp}{fs}},$$

wherein fp is the first frequency, and fs is the specified sampling frequency; or $$B = \frac{F-1}{1 - e^{-\frac{2*\pi*fz}{fs}}},$$

wherein fz is the second frequency.

21. The method of claim 19, wherein said regulating via the respective digital control loop for the output voltage comprises:
   sampling the output voltage at a specified sampling frequency to obtain a digital voltage value; and
   one or more of:

$$F = e^{-\frac{2*\pi*fp}{fs}},$$

wherein fp is the first frequency, and fs is the specified sampling frequency; or $$B = \frac{F-1}{1 - e^{-\frac{2*\pi*fz}{fs}}},$$

wherein fz is the second frequency.

22. The method of claim 19, wherein A=1−(B+F).

* * * * *

UNITED STATES PATENT AND TRADEMARK OFFICE
CERTIFICATE OF CORRECTION

PATENT NO. : 8,797,025 B2  
APPLICATION NO. : 13/154237  
DATED : August 5, 2014  
INVENTOR(S) : Regier et al.

Page 1 of 1

It is certified that error appears in the above-identified patent and that said Letters Patent is hereby corrected as shown below:

In the Claims:

Claim 4, Column 12, Line 2, please delete "value, represents" and substitute -- value, $X_{i-1}$ represents --.

Signed and Sealed this
Twenty-first Day of October, 2014

Michelle K. Lee
*Deputy Director of the United States Patent and Trademark Office*